United States Patent [19]
Kadota

[11] 4,384,264
[45] May 17, 1983

[54] SURFACE ACOUSTIC WAVE DEVICE
[75] Inventor: Michio Kadota, Kyoto, Japan
[73] Assignee: Murata Manufacturing Company Ltd., Japan
[21] Appl. No.: 141,369
[22] Filed: Apr. 18, 1980
[30] Foreign Application Priority Data Apr. 24, 1979 [JP] Japan ................... 54-50977
Nov. 16, 1979 [JP] Japan ................... 54-149352
Mar. 5, 1980 [JP] Japan ................... 55-28273
Mar. 5, 1980 [JP] Japan ................... 55-28274

[51] Int. Cl.³ ................... H03H 9/145; H03H 9/64; H03H 9/42
[52] U.S. Cl. ................... 333/193; 333/154; 333/196
[58] Field of Search ................... 333/150–155, 333/193–196; 310/313 R, 313 A, 313 B, 313 C, 313 D; 29/25.35

[56] References Cited
U.S. PATENT DOCUMENTS 3,600,710 8/1971 Adler et al. ................... 333/193
3,675,054 7/1972 Jones et al. ................... 333/150 X
3,801,935 4/1974 Mitchell ................... 333/193

Primary Examiner—Marvin L. Nussbaum
Attorney, Agent, or Firm—Ostrolenk, Faber, Gerb & Soffen

[57] ABSTRACT

A surface acoustic wave device comprises a substrate and a set of interdigital electrodes disposed thereon and spaced apart. One interdigital electrode is divided along the propagating direction of the surface acoustic wave into a plurality of portion interdigital electrodes which are electrically connected in series. The electrode pattern of the one interdigital electrode is formed asymmetrically such that the static capacitances of at least two adjacent portion electrodes thereof are different from each other, preferably in such a manner that when the device is installed, the total effective static capacitances of the two adjacent portion electrodes will be substantially equal. The static capacitance of the portion electrode having a comb shaped electrode thereof which is to be grounded is selected to be smaller than that of the other portion electrode. In case of the portion electrode not having a comb shaped electrode grounded, the static capacitance of the portion electrode closer to the other interdigital electrode is selected to be smaller than of the other portion electrode.

12 Claims, 27 Drawing Figures

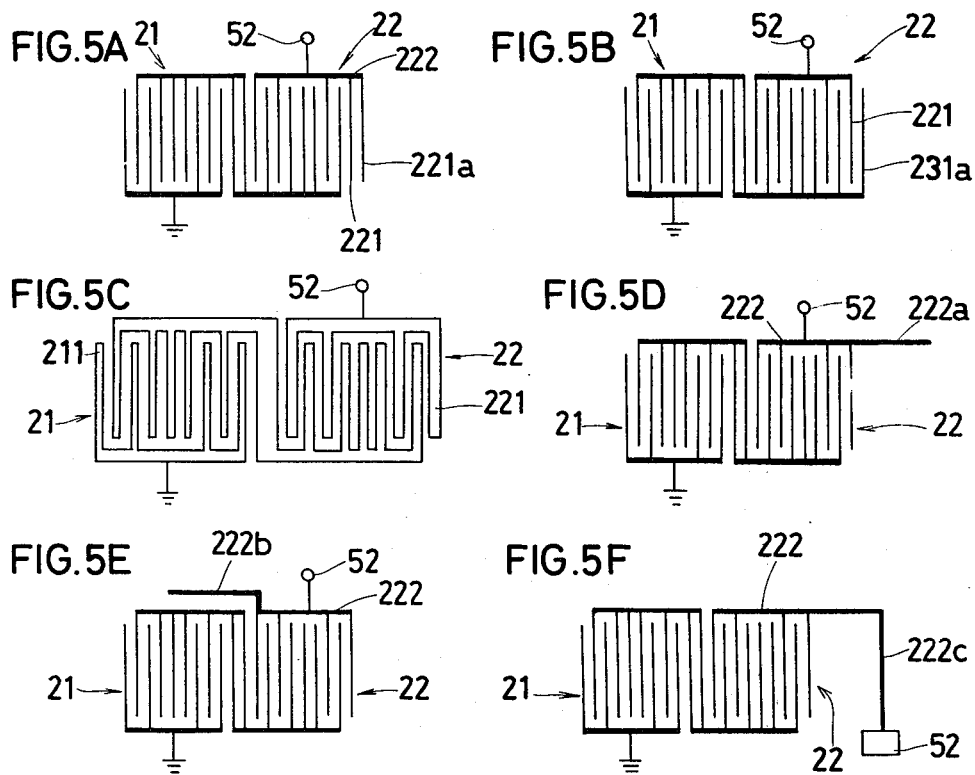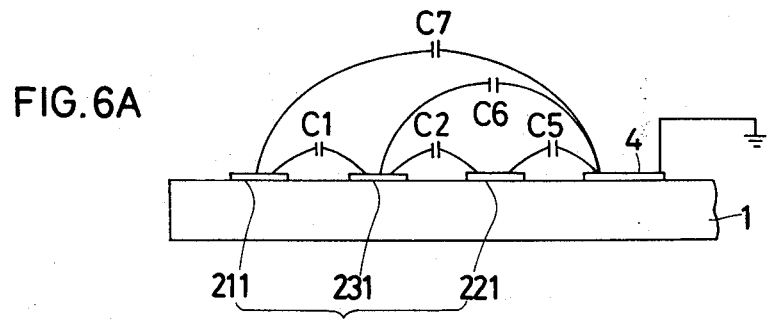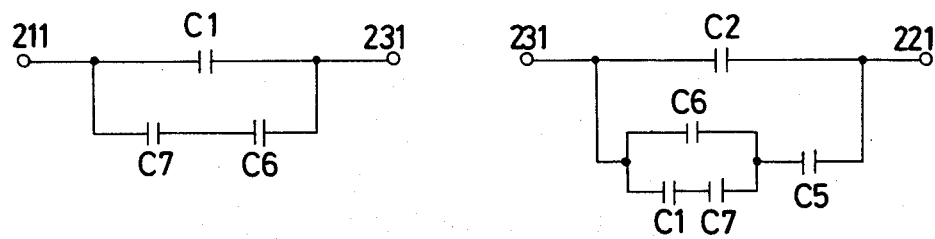

SURFACE ACOUSTIC WAVE DEVICE

BACKGROUND OF THE INVENTION

1. Field of the Invention

The present invention relates to a surface acoustic wave device. More specifically, the present invention relates to a surface acoustic wave device having a so-called divided type interdigital electrode wherein at least one of two interdigital electrodes is divided into at least two in the propagating direction of the surface acoustic wave and the divided interdigital electrodes are electrically connected in series.

2. Description of the Prior Art

Generally, an interdigital electrode used as a transducer of a surface acoustic wave device comprises a set of comb shaped electrodes having a number of electrode fingers and which are interdigitated each other. The static capacitance of the transducer is determined as the sum of the capacitances between the adjacent opposing electrode fingers. The capacitance of the transducer becomes relatively large when the dielectric constant of a piezoelectric substrate of the surface acoustic wave device is large. Accordingly, in assembling a surface acoustic wave device in an electric circuit, a difficulty could arise in attaining the impedance matching of the same with a preceding stage circuit and/or a succeeding stage circuit. In order to eliminate such difficulty, an approach has been proposed wherein the interdigital electrode is divided into a plurality of portion electrodes in the propagating direction of the surface acoustic wave and the plurality of portion electrodes are electrically connected in series, so that the total capacitance may be decreased. In employing the above described approach, in case of a surface acoustic wave of a normal electrode pattern type, for example, the electrode pattern is selected such that the electrode pattern may be symmetrical with respect to left and right, including the point symmetry, for the purpose of preventing degradation of the frequency characteristic due to the above described division. According to a symmetrical arrangement of the electrode pattern in case of a surface acoustic wave device having a normal electrode pattern, it is supposed that a sufficiently good frequency characteristic is attained insofar as attention is given to the electrode pattern, unless stray capacitances are considered.

A surface acoustic wave device having a divided type interdigital electrode is disclosed in, for example, U.S. Pat. No. 3,600,710 issued Aug. 17, 1971 to Robert Alder; British Pat. No. 1,362,238 (complete specification published July 31, 1974); U.S. Pat. No. 4,143,343 issued Mar. 6, 1979 assigned to the same assignee as the present invention; and others.

FIG. 1 is a view showing one example of a surface acoustic wave device showing the background of the invention. Referring to FIG. 1, a surface acoustic wave device comprises a set of interdigital electrodes 2 and 3 formed on a piezoelectric substrate 1. The interdigital electrodes 2 and 3 constitute an input (or an output) transducer and an output (or an input) transducer, respectively. The set of interdigital electrodes 2 and 3 are formed spaced apart a predetermined distance and a shield electrode 4 is formed as necessary on the substrate 1 between the electrodes 2 and 3. One interdigital electrode 2 out of the set of interdigital electrodes 2 and 3 is divided into a plurality of portion electrodes 21 and 22 (two in the embodiment shown), spaced apart in the propagating direction of the surface acoustic wave. The divided portion electrodes 21 and 22 are electrically connected in series. The portion electrode 21 comprises two comb shaped electrodes. One comb shaped electrode out of these two comb shaped electrodes comprises a plurality of electrode fingers 211 and a connection electrode 212 for commonly connecting one end of each of these electrode fingers 211. The other comb shaped electrode comprises a plurality of electrode fingers 231 and a connection electrode 232 for commonly connecting one end of each of these electrode fingers 231. These electrode fingers 211 and 231 are interdigitated forming one portion interdigital electrode (referred to as "portion electrode" hereinafter). The portion electrode 22 comprises two comb shaped electrodes. One comb shaped electrode out of these two comb shaped electrodes comprises a plurality of electrode fingers 221, and a connection electrode 222 for commonly connecting one end of each of these electrode fingers 221. The other comb shaped electrode comprises a plurality of electrode fingers 231 and a connection electrode 232 for common connecting one end of each of these electrode fingers 231. These electrode fingers 221 and 231 are interdigitated to form one portion interdigital electrode. Lead electrodes 51, 52, 53 and 54 are further formed on the substrate 1. Although not shown, these lead electrodes 51 to 54 are connected to lead terminals. Since a general operation of such surface acoustic wave device is well-known to those skilled in the art, it is not believed necessary to describe the same in detail.

Such a surface acoustic wave device has been used as a filter constituting a video intermediate frequency circuit of a television receiver, for example. FIG. 2 is a graph showing one example of a filter characteristic of such surface acoustic wave device. The filter has been designed such that the central frequency is approximately 36.5 MHz and attenuation poles are exhibited in the vicinity of a lower frequency of approximately 32 MHz and a higher frequency of approximately 40.4 MHz.

On the other hand, in using such a surface acoustic wave device having a filter characteristic as shown in FIG. 2, for example, conventionally it has been believed that most preferably the static capacitances and thus the electrode patterns (in case of a normal electrode pattern type) of the portion electrodes 21 and 22 shown in FIG. 1 should be the same and accordingly such surface acoustic wave device has been conventionally designed in such belief. However, when the other interdigital electrode, the shield electrode and so on are also formed on the substrate, as shown in FIG. 1, and a surface acoustic wave device is completed by using lead terminals, not shown, a package, not shown, and so on and then such surface acoustic wave device is installed in an actual video intermediate frequency circuit of a television receiver, for example, i.e. when a surface acoustic wave device is actually installed, a phenomenon was observed in which the attenuation at the attenuation poles becomes small, as shown by the curve A in FIG. 2. Nevertheless, conventionally it has not been believed that the reason why the characteristic of the attenuation poles is degraded when a surface acoustic wave device is actually installed is that such degradation is related to the static capacitance of the electrode but rather that it is related to some other cause. For example, in designing an electrode pattern of a surface acoustic wave device, generally a Fourier transformation has been employed, whereby the electrode pattern is determined. It was believed that a discrepancy between the Fourier transformation employed in designing such electrode pattern and the actual design was one of such causes. Conventionally it was also believed that the accuracy in the actual manufacture of a piezoelectric material and an electrode pattern was another cause. Accordingly, conventionally, even when degradation occurred in characteristic of the attenuation poles as shown by the curve A in FIG. 2, for example, consideration was given only to accuracy in designing an electrode pattern and manufacturing a surface acoustic wave device and various improvements were made thereon. Nevertheless, in spite of such an attempt to improve the characteristic in attenuation poles, a surface acoustic wave device of a filter characteristic having a satisfactory degree of attenuation at the attenuation poles was not obtained.

Under these circumstances, the inventor turned his attention to the static capacitance of the divided portion electrodes based on his doubt that degradation of the attenuation at the attenuation poles is related to the static capacitance of the electrode and made one calculation of interest. According to the calculation, in a chip not packaged and installed in a circuit, i.e. in a chip including only the interdigital electrode 2, i.e. the portion electrodes 21 and 22 on the substrate 1, as shown in FIG. 1 the static capacitances of the portion electrodes 21 and 22 were intentionally changed, whereupon the frequency characteristic was calculated. As a result, the characteristic as shown in FIG. 3 was obtained. The curves A, B and C in FIG. 3 all show the frequency characteristics of the interdigital electrode 2 divided into the portion electrodes 21 and 22. More specifically, the curve A of FIG. 3 shows a calculation result obtained when the static capacitances of the two portion electrodes 21 and 22 are made different by 20% from each other, the curve B shows a calculation result obtained from the static capacitances of the two portion electrodes 21 and 22 are made different by 10% from each other, and the curve C shows a calculation result obtained when the static capacitances of the two portion electrodes 21 and 22 are the same. From the calculation result shown in FIG. 3, it is hypothesized that as far as the attenuation poles of the filter characteristic are concerned it is most preferred to select the static capacitances of the two portion electrodes 21 and 22 to be the same. Accordingly, in case of a normal electrode pattern type, the conventional belief that the electrode patterns of the respective portion electrodes 21 and 22 should be disposed in a symmetrical manner, including the point symmetry, was justified in making the respective static capacitances the same. Nevertheless, the above described degradation of the attenuation pole characteristic occurs in installing a surface acoustic wave device in an electric circuit. Therefore, the inventor considered the cause of degradation by paying his attention to this point and reached the following conclusion. More specifically, the inventor noticed that even when the electrode patterns of the divided portion electrodes 21 and 22 shown in FIG. 1, for example, are formed in a symmetrical manner, thereby to make the static capacitances of the portion electrodes to each other, the equal capacitances are equal only when only the portion electrodes 21 and 22 are formed on the substrate 1. Then the inventor hypothesized that imbalance of the static capacitances could have occurred due to the formation of the other interdigital electrode 3, the shield electrode 4, the lead electrodes 51 to 54, and further formation of a rear surface electrode, as necessary, and so on.

SUMMARY OF THE INVENTION

A surface acoustic wave device according to a preferred embodiment of the invention comprises, in a chip form, a set of interdigital electrodes formed on a substrate spaced apart by a predetermined distance, at least one interdigital electrode being divided into a plurality of portion electrodes. The static capacitances of at least two adjacent portion electrodes of the plurality of portion electrodes are made different from each other initially, before other elements are formed on the chip such that the static capacitances of the respective portion electrodes when the surface acoustic wave device is actually installed may be substantially equal to each other. As a result, when the surface acoustic wave device is actually installed in an electric circuit, a frequency characteristic having an attenuation characteristic that is not degraded at the attenuation poles can be attained.

If either of the paired comb shaped electrodes constituting each of at least two adjacent portion electrodes is connected to the ground, static capacitance of the portion electrode including the comb shaped electrode being grounded is selected to be smaller than the static capacitance of the other portion electrode. If the comb shaped electrodes constituting each of at least two adjacent portion electrodes are not connected to ground, the static capacitance of the portion electrode closer to the other interdigital electrode is selected to be smaller as compared with the static capacitance of the other portion electrode.

If one interdigital electrode is divided into two or more portion electrodes, the static capacitance of each portion electrodes is selected such that the static capacitance of each portion electrode is smaller in proportion as that portion electrode is closer to the other interdigital electrode.

Accordingly, a principal object of the present invention is to provide an improved surface acoustic wave device including a divided type interdigital electrode that is capable of exhibiting a sufficiently large attenuation at the attenuation pole in the frequency characteristic.

Another object of the present invention is to provide an improved surface acoustic wave device that is capable of exhibiting a sufficiently large attenuation at the attenuation pole in the frequency characteristic when the surface acoustic wave device is actually installed.

A further object of the present invention is to provide an improved surface acoustic wave device wherein the electrode patterns of at least two adjacent portion electrodes of divided portion electrodes are formed in an asymmetrical manner in case of a normal electrode pattern type, for example.

These objects and other objects, features, aspects and advantages of the present invention will become more apparent from the following detailed description of the present invention when taken in conjunction with the accompanying drawings.

BRIEF DESCRIPTION OF THE DRAWINGS

FIGS. 5A to 5F are views showing various electrode patterns of a preferred embodiment of the present invention;

FIG. 6A is a diagrammatic view showing the static capacitances at various portions of a surface acoustic wave device when the device is actually installed, for explaining another embodiment of the present invention;

FIGS. 6B and 6C are equivalent circuit diagrams of the FIG. 6A diagram;

DESCRIPTION OF THE PREFERRED EMBODIMENTS

Figure 4A:
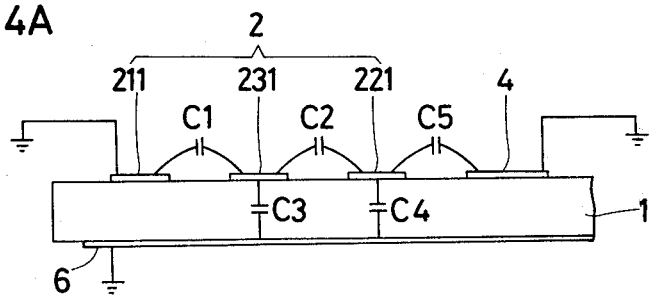
FIG. 4A is a diagrammatic view showing the static capacitances at various portions of a surface acoustic wave device when the device is actually installed, for explaining one embodiment of the present invention.

FIG. 4A is a view showing the static capacitances at various portions of a surface acoustic wave device when the device is actually installed in an electric circuit for explaining the present invention. The surface acoustic wave device shown in FIG. 4A comprises a rear surface electrode 6 formed on the whole rear surface of the substrate 1. Referring to FIG. 4A, the reference numerals "211", "221" and "231" each collectively denote the electrode fingers 211, the electrode fingers 221, and the electrode fingers 231, respectively, for simplicity of illustration. The static capacitance C1 denotes the total capacitance formed between the electrode fingers 211, and the electrode fingers 231, overlapping with the adjacent electrode fingers 211 in FIG. 1, and the static capacitance C2 denotes a total capacitance formed between the comb shaped electrodes 221 and the comb shaped electrodes 231 overlapping with the adjacent electrode fingers 221 in FIG. 1. The static capacitance C3 denotes a total capacitance formed between the electrode fingers 231 and the rear surface electrode 6. The static capacitance C4 denotes a total capacitance formed between the electrode fingers 221 and the rear surface electrode 6. The static capacitance C5 denotes a total capacitance formed between the electrode fingers 221 forming the portion electrode 22 and the shield electrode 4 formed adjacent thereto. Referring to FIG. 4A, the group of the electrode fingers 211 and the shield electrode 4 and the rear surface electrode 6 are connected to the ground.

Figure 4B:
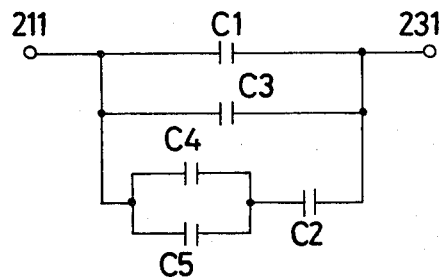
FIGS. 4B and 4C are equivalent circuit diagrams of the FIG. 4A diagram.
Figure 4C:
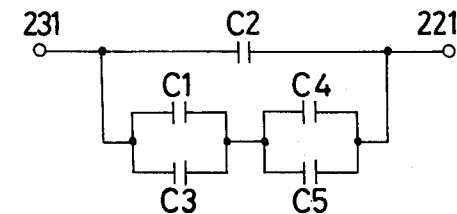

In the following the static capacitances at various portions in the FIG. 4A diagram will be considered with simultaneous reference to the equivalent circuit diagrams shown in FIGS. 4B and 4C.

Referring to FIG. 4A, the divided type interdigital electrode 2 is constituted by the three comb shaped electrodes and the group of the electrode fingers 211 is connected to the ground. A voltage is applied between the electrodes 211 and 221, whereby the voltage is divided to between the electrodes 211 and 231 and between the electrodes 231 and 221, i.e. portion electrodes 21 and 22. Referring to FIG. 4A, assuming that the static capacitance between the electrodes 211 and 231 is denoted by $C_{13}$ and the static capacitance between the electrodes 231 and 221 is denoted by $C_{32}$, the static capacitance $C_{13}$ may be represented by the equivalent circuit diagram shown in FIG. 4B and the static capacitance $C_{32}$ is represented by the equivalent circuit shown in FIG. 4C. As seen from FIGS. 4B and 4C, even if the electrode patterns are designed such that the static capacitances C1 and C2 in a state of only the chip may be equal to each other in accordance with the electrode pattern shown in FIG. 1, the static capacitance $C_{32}$ becomes smaller than the static capacitance $C_{13}$ once the device is actually installed. More specifically, according to the conventional approach, the electrode patterns were designed such that the static capacitances C1 and C2 shown in FIG. 4A may be equal to each other only in a state of a chip of the device per se. Accordingly, once the device is actually installed as shown in FIGS. 4B and 4C, imbalance of the static capacitances arises between the portion electrodes 21 and 22.

Therefore, according to the embodiment of the present invention, the electrode patterns are designed such that the static capacitances C1 and C2 are intentionally made different from each other in a state of only the chip per se, as not packaged and not installed in a circuit, i.e. in the state of a chip including only an interdigital electrode on a substrate, in order that the static capacitances $C_{13}$ and $C_{32}$ may be substantially the same after the surface acoustic wave device is actually installed. For example, the static capacitance C2 is set to be larger than the static capacitance C1 of only the chip per se. To that end, the electrode pattern of the interdigital electrode 2, i.e. the electrode patterns of the portion electrodes 21 and 22 must be different from each other to create the desired imbalance in the static capacitances. FIGS. 5A to 5F are views showing different examples of the electrode patterns of a preferred embodiment of the present invention. These electrode patterns are all selected such that the electrode patterns of the portion electrodes 21 and 22 constituting the interdigital electrode 2 may be asymmetrical to each other in case of a normal electrode pattern type, so that the static capacitance C2 (FIG. 4A) may be larger than the static capacitance C1 in a state of only the chip of the surface acoustic wave device. Meanwhile, even in the case where the rear electrode 6 is not provided in the FIG. 4A embodiment and the electrode fingers 221 are connected to the ground, the respective static capacitances are selected in the same relation as described above.

FIG. 5A shows an example wherein a new electrode finger 221a is added to the comb shaped electrode, which is not connected to the ground, of the portion electrode 22. The additional finger 221a is connected to the connection electrode 222 such that the it may be at the same potential as that of the electrode finger 221 adjacent thereto. Accordingly, no new surface acoustic wave is excited by the additional electrode finger 221a. As a rsult, the static capacitance C2 (FIG. 4A) can be made large with respect to the static capacitance C1 (FIG. 4A) as a function of the additional electrode finger 221a. The reason is that the static capacitance is influenced by the number of the electrode fingers.

The FIG. 5B example has more surface acoustic wave exciting sources in the portion electrode 22 than in the portion electrode 21. More specifically, the FIG. 5B example has an added electrode finger 231a, which is placed at a potential different from that of the adjacent electrode finger 221, whereby that portion serves as an exciting source of the surface acoustic wave. In this example also, since the static capacitance is influenced by the number of electrode fingers, the static capacitance C2 (FIG. 4A) can be made larger than the static capacitance C1 (FIG. 4A).

In the FIG. 5C example, the width of the respective electrode fingers 211 and 231 constituting the portion electrode 21 and the width of the electrode fingers 221 and 231 constituting the portion electrode 22 are selected to be different from each other. More specifically, the width of the electrode fingers constituting the portion electrode 22 is selected to be larger than the width of the electrode fingers constituting the other portion electrode. Since the static capacitance is also influenced by the width of these electrode fingers, the static capacitance C2 can be selected to be larger than the static capacitance C1 also in the FIG. 5C example.

FIGS. 5D and 5E both show examples wherein an additional electrode that is not necessary for the generation per se of surface acoustic waves is connected to the portion electrode 22. In the FIG. 5D example, the additional electrode 222a is formed to the connection electrode 222, whereby the static capacitance is increased. In the FIG. 5E example as well, similarly the additional electrode 222b is connected to the connection electrode 222, so that the static capacitance may be increased. In the FIG. 5F example, the position of the lead electrode 52 shown in FIG. 1, for example is formed at a position different from the position shown in FIG. 1, while an additional electrode 222c is connected from the connection electrode 222 to the lead electrode 52. In this example also, the static capacitance C2 (FIG. 4A) can be made larger than the static capacitance C1 (FIG. 4A) in a state of only the chip.

According to the examples shown in FIGS. 5A to 5F, the static capacitance C2 can be selected to be larger than the static capacitance C1 in a state of only the chip of the surface acoustic wave device. As a result, when the surface acoustic wave device is actually installed, i.e. lead terminals are provided to the chip and the chip is mounted in a package to complete the device and then the device is actually connected in an electric circuit, the static capacitances C2 and C1 become substantially equal to each other. Therefore, degradation of the attenuation at the attenuation poles in the frequency characteristic does not occur due to imbalance of the capacitances in the actually installed state of the device.

Figure 1:
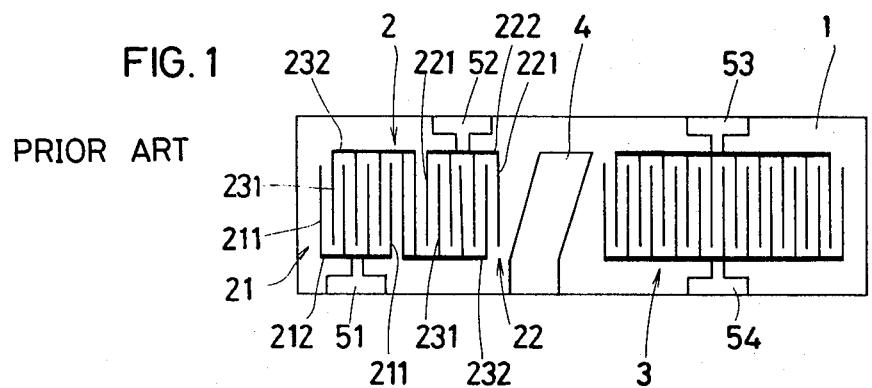
FIG. 1 is a view showing one example of a surface acoustic wave device including a conventional divided type interdigital electrode which constitutes the background of the invention.
Figure 2:
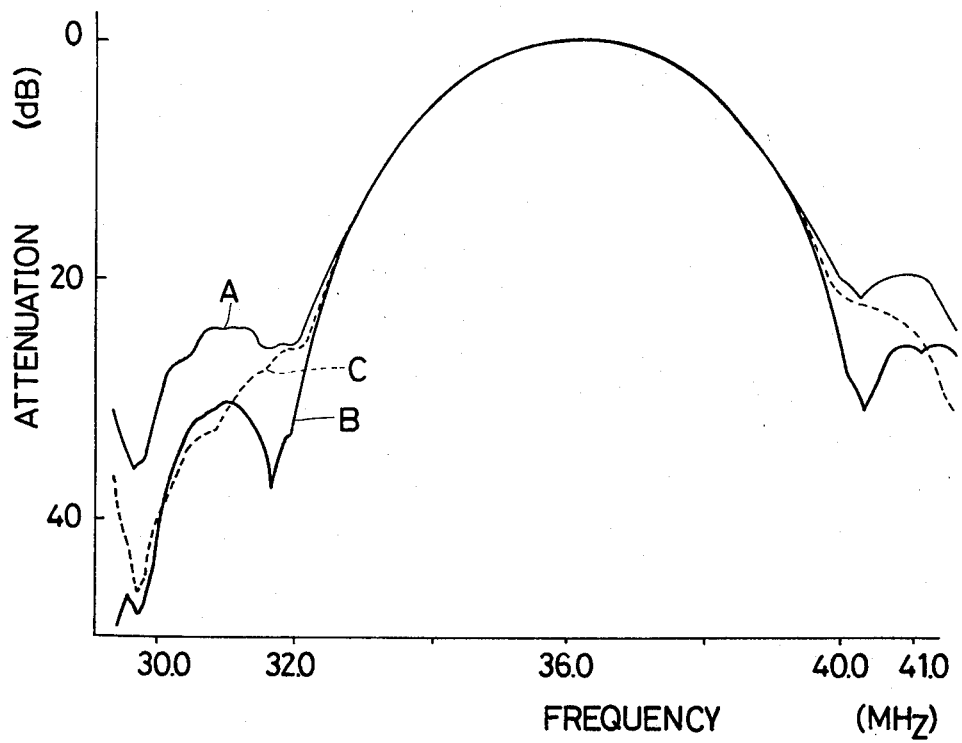
FIG. 2 is a graph showing one example of a frequency characteristic of a conventional surface acoustic wave device and the inventive surface acoustic wave device.
Figure 3:
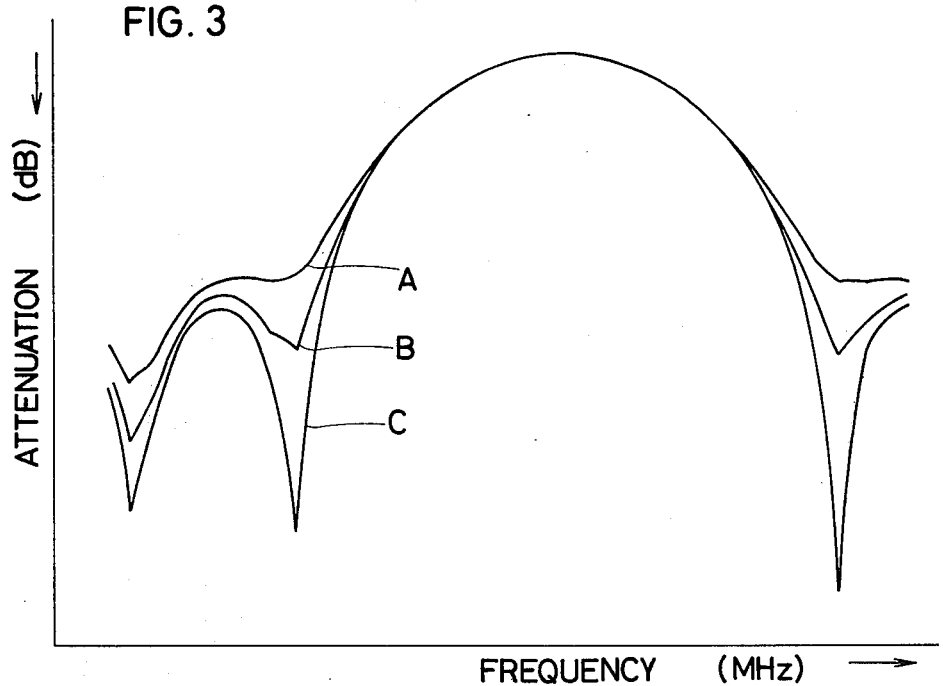
FIG. 3 is a graph showing the frequency characteristic obtained by the calculation made by the inventor for explaining the background of the invention.

In a case where a surface acoustic wave device is fabricated by employing the electrode pattern shown in FIG. 5B, for example, as an electrode pattern of the interdigital electrode 2 shown in FIG. 1, and by printing an electrically conductive paint on the rear surface such that the device is adhered to a metallic base of a hermetic seal, the frequency characteristic of the device as actually installed becomes as shown by the curve B in FIG. 2, wherein the attenuation at the attenuation poles can be made sufficiently large. Meanwhile, the curve A exhibiting a conventional (FIG. 1) example, the curve C in FIG. 2 shows only for reference the frequency characteristic of a state of the chip wherein the static capacitance of the portion electrode 21 including the electrode fingers 211 being grounded is selected to be larger than the static capacitance of the other portion electrode 22. Thus, it would be appreciated that when the static capacitances are selected in a directly opposite manner to that of the above described embodiment of the present invention the problem of degradation of the attenuation at the attenuation poles is not solved at all. In other words, degradation of the attenuation at the attenuation poles in the frequency characteristic can be eliminated only by selecting the static capacitances of various portions in accordance with the present invention.

Meanwhile, in any of the above described examples shown in FIGS. 5A to 5F, the portion electrode selected to exhibit an increased static capacitance, i.e. the portion electrode 22, was subjected to some processing or modification, in order to make different the static capacitances of the portion electrodes 21 and 22. However, alternatively some modification or processing may be applied to the portion electrode such as the portion electrode 21 being selected to exhibit a decreased static capacitance, so that the difference of the static capacitances is caused in the portion electrodes. For example, an electrode finger of the portion electrode 21 such as the outermost electrode finger of the comb shaped electrode may be removed, or the width of the outermost electrode finger may be narrowed. The same may be applied to various examples to be described subsequently, in order to make different the static capacitances of the respective portion electrodes.

FIG. 6A is a view showing the static capacitances at various portions of a surface acoustic wave device as actually installed for explaining another embodiment of the present invention. FIG. 6B and 6C are equivalent circuit diagrams of the FIG. 6A embodiment and correspond to FIGS. 4B and 4C, respectively. In the FIG. 6A embodiment, no rear surface electrode is formed on the rear surface of the substrate 1 and the electrode fingers 211 of the portion electrode 21 is not connected to the ground. The static capacitances C1, C2 and C5 are the same as the corresponding ones shown in FIG. 4A. The static capacitance C6 denotes a total static capacitance formed between the electrode fingers 231 and the shield electrode 4 shown in FIG. 1, and the static capacitance C7 denotes a total static capacitance formed between the electrode fingers 211 and the shield electrode 4 in FIG. 1. Meanwhile, since the capacitance C6 in the FIG. 4A embodiment is negligibly small as compared with the other capacitances, an illustration thereof was omitted. In the FIG. 4A embodiment, the capacitance C7 is zero. According to the FIG. 6A embodiment, the static capacitance $C_{13}$ between the electrode fingers 211 and 231 can be represented by the equivalent circuit diagram shown in FIG. 6B and the static capacitance $C_{32}$ between the electrodes 231 and 221 may be represented by the equivalent circuit diagram shown in FIG. 6C. As seen from FIGS. 6B and 6C, even if the electrode patterns are designed such that the static capacitances C1 and C2 in a state of only the chip may be equal to each other in accordance with the electrode pattern shown in FIG. 1, the static capacitance of the portion electrode 22 closer to the shield electrode 4, i.e. closer to the other interdigital electrode 3 (FIG. 1), becomes larger then the static capacitance of the portion electrode 21 in a state where the device is actually installed, with the result that imbalance of the static capacitances is caused. Accordingly, in the embodiment shown, the electrode patterns are selected such that the static capacitance of the portion electrode 21 may be larger than the static capacitance of the portion electrode 22 in a state of only the chip, so that the two static capacitances may be substantially equal to each other in a state where the surface acoustic wave device is actually installed. As a result, the frequency characteristic having the attenuation poles of a sufficient attenuation amount as shown by the curve B in FIG. 2 can be obtained. In order to increase the static capacitance of the portion electrode 21 as compared with the static capacitance of the portion electrode 22, some additional electrode is formed and connected to the portion electrode 21 or some processing for decreasing the static capacitance is applied to the portion electrode 22, as described previously in conjunction with the above described embodiments. Meanwhile, assuming that the rear surface electrode 6 is formed in the FIG. 6 embodiment, the respective static capacitance may be selected in the same relation as described above, unless the electrode fingers 211 are connected to the ground.

Although in the foregoing description and in the subsequent description a divided type interdigital electrode was and is specifically described by taking an example of a normal type electrode, it should be pointed out that the present invention can also be equally applied to surface acoustic wave devices employing various weighted electrodes.

Figure 7:
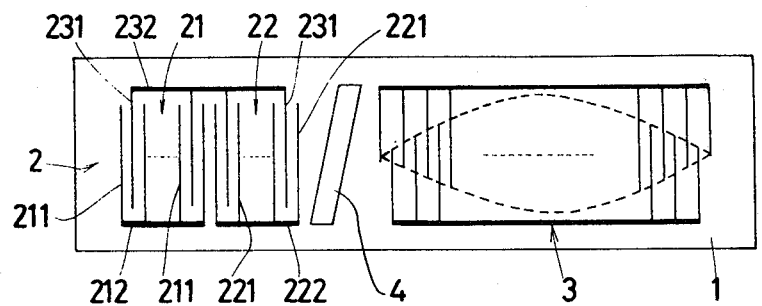
FIG. 7 is a view showing another embodiment of the present invention.

FIG. 7 is a view showing a further embodiment of the present invention. In particular, the FIG. 7 embodiment is substantially the same as the FIG. 1 embodiment, except that the static capacitances of the portion electrodes 21 and 22 are different and the FIG. 7 embodiment employs a weighted electrode in the other interdigital electrode 3. According to the FIG. 7 embodiment, the total number of pairs of the electrode fingers of one interdigital electrode 2 is selected to be a relatively small number such as 5 to 20. The interdigital electrode 2 comprises two portion electrodes 21 and 22. In the FIG. 7 embodiment, the common electrode 222 is connected to the ground through the lead terminal, not shown. The static capacitance of the portion electrode 21 is determined by the spacings between the adjacent fingers of the electrode finger group constituting the portion electrode 21, the overlapping lengthes, the electrode width, and so on and the total capacitance of the respective unit capacitances is denoted by C1, for example. On the other hand, the static capacitance of the portion electrode 22 is also determined in the same manner and is denoted by C2. These static capacitances C1 and C2 correspond to those corresponding ones shown in FIGS. 4A and 6A. In the FIG. 7 embodiment, the ratio of the static capacitances C1 and C2 is selected to be in the range of C1/C2=1.03 to 1.45. The value of the ratio of the static capacitances C1 and C2 (1.03 to 1.45) can be determined by the number of electrode fingers of the comb shaped electrodes included in each of the portion electrodes 21 and 22, assuming that the remaining factors or conditions are the same. However, in order to make different the static capacitances C1 and C2, thereby to attain a predetermined ratio, the previously described embodiments may be employed in the FIG. 7 embodiment.

Figure 9A:
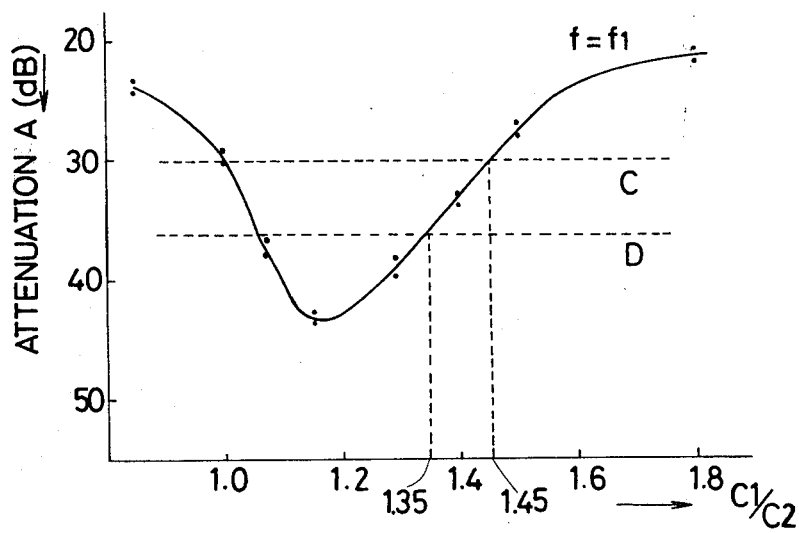
FIGS. 9A and 9B are graphs each showing the characteristic of the attenuation amount with respect to the static capacitance ratio for explaining the FIG. 7 embodiment.
Figure 9B:
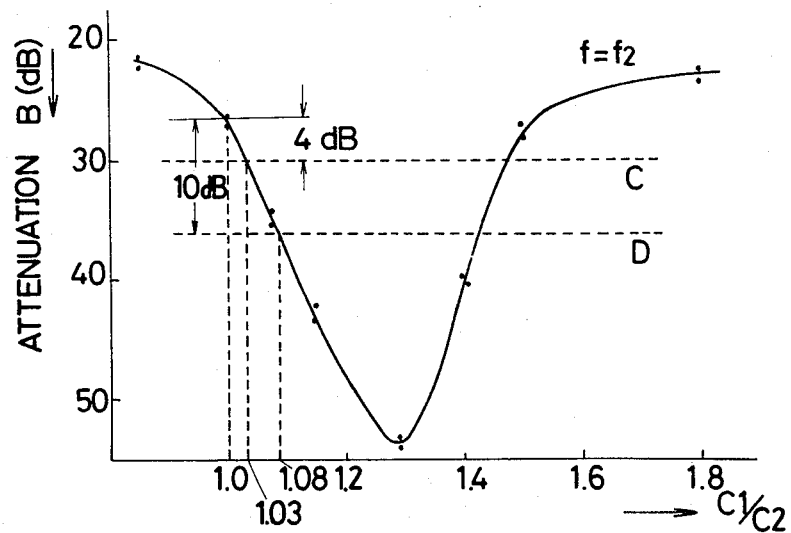
Figure 8:
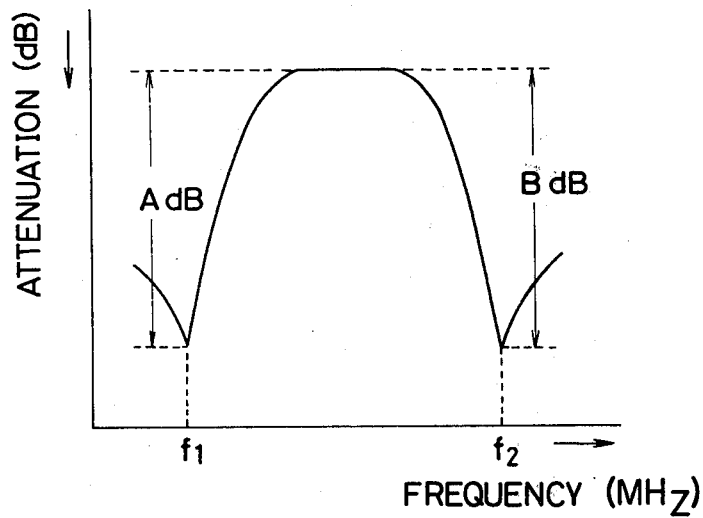
FIG. 8 is a graph showing the frequency characteristic explaining the FIG. 7 embodiment.

Now the reason why the ratio static capacitances C1 and C2 is selected to be in the range of C1/C2=1.03 to 1.45 in a state of only the chip of the FIG. 7 embodiment will be described. At the outset, the frequency characteristic of the FIG. 7 surface acoustic wave device is shown in FIG. 8, on the assumption that the other interdigital electrode 3 is not directly related to the frequency characteristic of the device. Referring to FIG. 8, the frequencies at the attenuation poles positioned at both sides of the passband are assumed to be f1 and f2 and the attenuation at the attenuation poles with the attenuation amount of the central frequency as a reference is assumed to be A(dB), respectively and B(dB). In the case where such surface acoustic wave device is used as a filter of a video intermediate frequency circuit of a television receiver, for example, the frequency f1 corresponds to the video carrier frequency of the adjacent channel and the frequency f2 corresponds to the sound carrier frequency of the adjacent channel. When the number of pairs of the electrode fingers of the interdigital electrode 2 is selected to be 7 to 8, by varying the ratio of C1/C2 to various values, the attenuation A(dB) and B(dB) at the attenuation poles are measured. The results thus obtained are shown in FIGS. 9A and 9B. Referring to FIG. 9B, consider a level C having the value improved by 4 dB with respect to the attenuation in the case of the static capacitance ratio C1/C2=1.0 in a state of only the conventional chip. The range of the ratio C1/C2 exhibiting the attenuation larger than the level C is smaller than approximately 1.45 with respect to the attenuation pole for the frequency f1 and is larger than approximately 1.03 with respect to the attenuation pole for the frequency f2. Thus, in accordance with the FIG. 7 embodiment, the static capacitance ratio C1/C2 is selected to be in the range of 1.03 to 1.45. By selecting the ratio in the above described manner, the attenuation at the attenuation poles can be improved by at least 4 dB, as shown in FIGS. 9A and 9B, as compared with those obtained by designing the electrode patterns such that the static capacitance ratio C1/C2 in a state of the conventional chip is the unity.

Referring to FIG. 9B, now consider the level D where the attenuation at the respective attenuation poles is improved by 10 dB as compared with those of the conventional device. The range of the ratio C1/C2 exhibiting the attenuation larger than the level D is smaller than approximately 1.35 at the attenuation pole for the frequency f1 and is larger than approximately 1.08 at the attenuation pole for the frequency f2. Accordingly, by selecting the static ratio C1/C2 to be in the range of 1.08 to 1.35, the attenuation at the two attenuation poles can be improved by more than 10 dB as compared with the conventional device.

Figure 10:
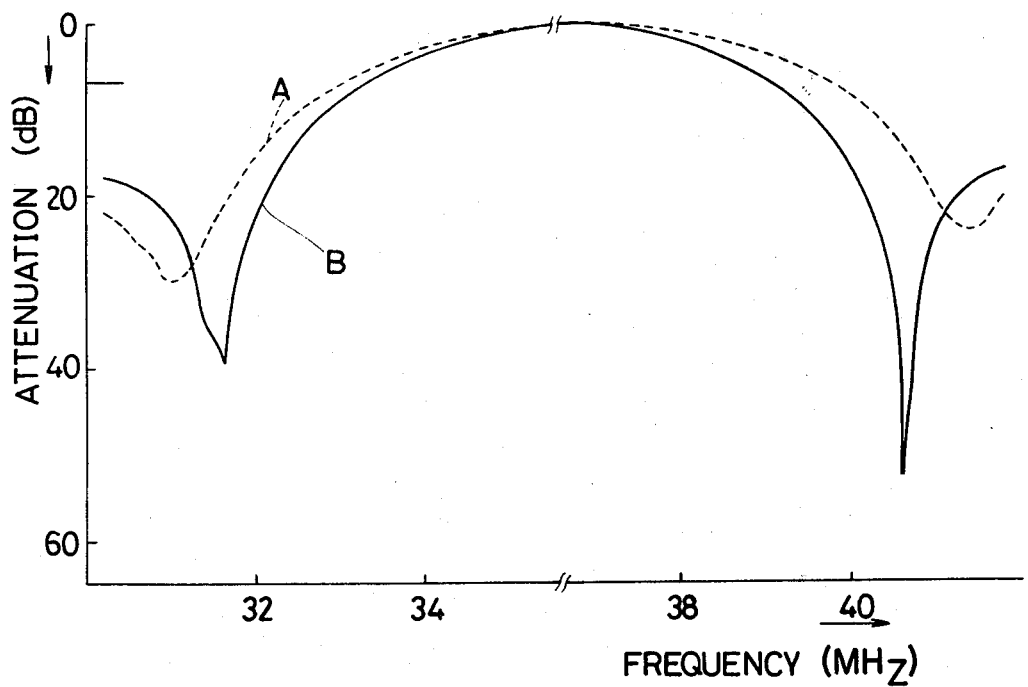
FIG. 10 is a graph for explaining the advantage of the FIG. 7 embodiment.

By selecting the static capacitance ratio C1/C2 in the vicinity of 1.2, the attenuation A(dB) and B(dB) can be considerably increased. More specifically, the curve A in FIG. 10 shows the conventional frequency characteristic and the curve B in FIG. 10 shows the frequency characteristic in the case where the static capacitance ratio C1/C2 is selected to be 1.28. As seen from FIG. 10, the optimum value of the static capacitance ratio C1/C2 is approximately 1.28 in the case of the FIG. 7 embodiment.

The characteristics shown in FIGS. 9A and 9B would be more or less changeable depending on the number of pairs of the electrode fingers constituting the interdigital electrode 2, the position and the shape of the shield electrode 4 and the other interdigital electrode 3. However, in the case where the number of pairs of the electrode fingers constituting the interdigital electrode 2 is a relatively small number such as 5 to 20, the most appropriate value of the static capacitance ratio C1/C2 merely slightly changes and sufficient attenuation amounts can be attained in the range of the ratio C1/C2 selected with the level C shown in FIGS. 9A and 9B as a reference.

Although now shown specifically, in the FIG. 7 embodiment the comb shaped electrode 221 constituting the portion electrode 22, i.e. the common electrode 222 is connected to ground; however, alternatively the comb shaped electrode 211 of the other portion electrode 21 or the common electrode 212 may be grounded. In such a case, assuming that the static capacitance of the portion electrode 21 including the grounded comb shaped electrode is C2 and the static capacitance of the other portion electrode 22 is C1, a surface acoustic wave device having the frequency characteristic showing drastically improved attenuation can be obtained based on the previously described static capacitance ratio C1/C2. In the case where any of the portion electrodes is not grounded, the static capacitance of the portion electrode closer to the other interdigital electrode 3, i.e. the portion electrode 22, is assumed to be C2 and the static capacitance of the other portion electrode 21 is assumed to be C1, and the static capacitance ratio C1/C2 is selected in the above described manner.

Figure 11:
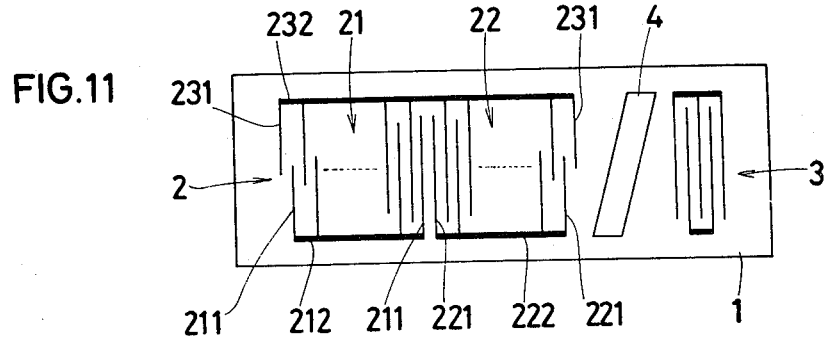
FIG. 11 is a view showing a further embodiment of the present invention.

FIG. 11 is a view showing still a further embodiment of the present invention. The total number of pairs of the electrode fingers constituting one interdigital electrode 2 is selected to be different from that of the previously described FIG. 7 embodiment and is selected to be a relatively large number of pairs such as 30 to 90. However, the FIG. 11 embodiment is further structured such that the overlapping lengths of the respective adjacent electrode fingers of one interdigital electrode 2 is selected to be different, i.e. the electrode 2 is configured in a weighted electrode based on the required frequency characteristic. Conversely, the other interdigital electrode 3 is configured in a normal type electrode. In the FIG. 11 embodiment, one of the comb shaped electrode constituting the portion electrodes 21 and 22, for example the portion electrode 22, of one interdigital electrode 2 is connected to ground. For example, the common electrode 222 constituting the portion electrode 22 is connected to ground through a lead terminal (not shown). Even in case of the FIG. 11 embodiment, the static capacitance of the portion electrode 21 is assumed to be C1 and the static capacitance of the portion electrode 22 is assumed to be C2. In the embodiment shown, the ratio of the static capacitances C1 and C2 in a state of only the chip is selected to be in the range of C1/C2=1.01 to 1.20. For the purpose of making different the static capacitances, an additional electrode as shown in FIGS. 5A to 5F may be provided. Alternatively, as described in conjunction with the FIG. 7 embodiment, the number of pairs of electrode fingers included in the portion electrodes 21 and 22 or the overlapping lengths of the adjacent electrode fingers may be selected.

Figure 12:
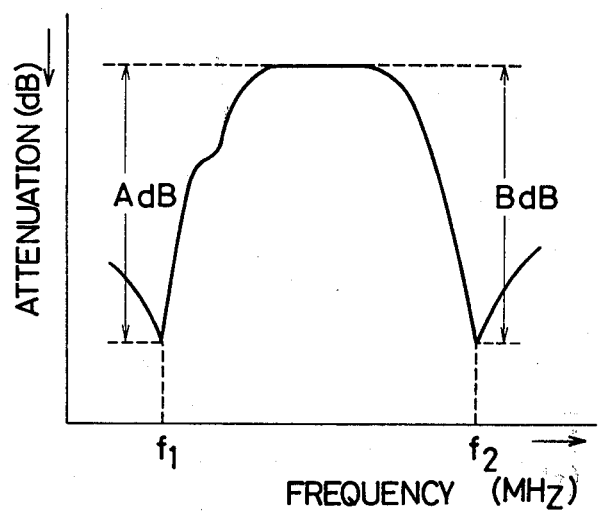
FIG. 12 is a graph showing the frequency characteristic explaining the FIG. 11 embodiment.

Now the reason why the static capacitance ratio is selected to be in the range of C1/C2=1.01 to 1.20 will be described. Assuming that the other interdigital electrode 3 is configured in a normal type electrode, the overall frequency characteristic of the FIG. 11 surface acoustic wave device is considered as shown in FIG. 12. Referring to FIG. 12, the frequencies of the attenuation poles at both sides of the passband are assumed to be f1 and f2. With the attenuation amount at the central frequency of the passband as a reference, the attenuation of the attenuation pole for the frequency f1 is assumed to be A(dB) and the attenuation at the attenuation pole for the frequency f2 is assumed to be B(dB). As described previously with reference to the FIG. 7 embodiment, these frequencies f1 and f2 correspond to the video carrier frequency of the adjacent channel and the video carrier frequency of the adjacent channel, respectively, if and when the surface acoustic wave device is used as a filter in a video intermediate frequency circuit of a television receiver.

Figure 13A:
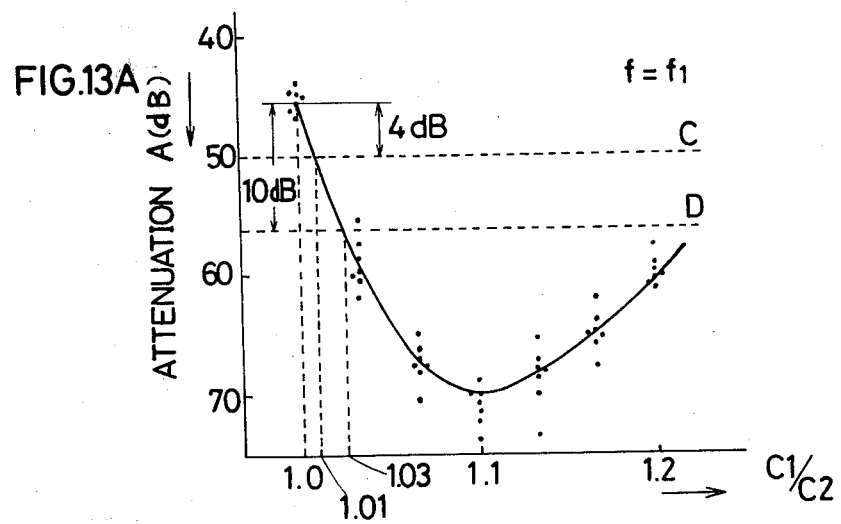
FIGS. 13A and 13B are graphs showing the characteristic of the attenuation amount with respect to the static capacitance ratio of the FIG. 11 embodiment.
Figure 13B:
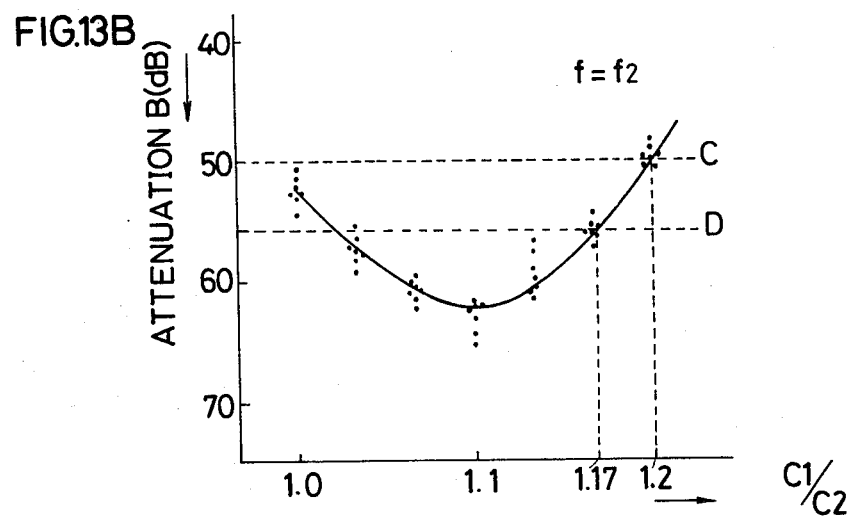

Now assuming that the total number of the pairs of the electrode fingers of one interdigital electrode 2 is 50, while the value of the static capacitance ratio C1/C2 is changed to various values by changing the number of pairs of the electrode fingers included in the portion electrodes 21 and 22, for example, the attenuation A(dB) and B(dB) were measured. The results thus obtained are shown in FIGS. 13A and 13B. Referring to FIG. 13A, consider a level C where the attenuation is improved by 4 dB as compared with those when the static capacitance ratio C1/C2=1.0 in a state of the conventional chip. As seen from FIGS. 13A and 13B, the range of the static capacitance ratio C1/C2 exhibiting the attenuation larger than the level C is larger than approximatey 1.01 at the attenuation pole for the frequency f1 and is smaller than approximately 1.20 at the attenuation pole for the frequency f2. Accordingly, in the embodiment shown, the static capacitance ratio C1/C2 is selected to be in the range of approximately 1.01 to 1.20 in a state of only the chip of the surface acoustic wave device. As a result, at both attenuation poles the attenuation can be improved by at least 4 dB as compared with those of the device of the conventional electrode pattern.

Referring to FIG. 13A, more preferably, consider a level D where the attenuation is improved by 10 dB as compared with the conventional one. The range of the static capacitance ratio C1/C2 exhibiting an attenuation larger than the level D is larger than approximately 1.03 at the attenuation pole for the frequency f1 and is smaller than approximately 1.17 at the attenuation pole for the frequency f2. Accordingly, preferably, in the embodiment shown the static capacitance ratio C1/C3 in a state of the chip is selected to be in the range of approximately 1.03 to 1.17. As a result, the attenuation at both attenuation poles in a state where the device is actually installed can be improved by more than 10 dB as compared with the device of a conventional electrode pattern.

Figure 14:
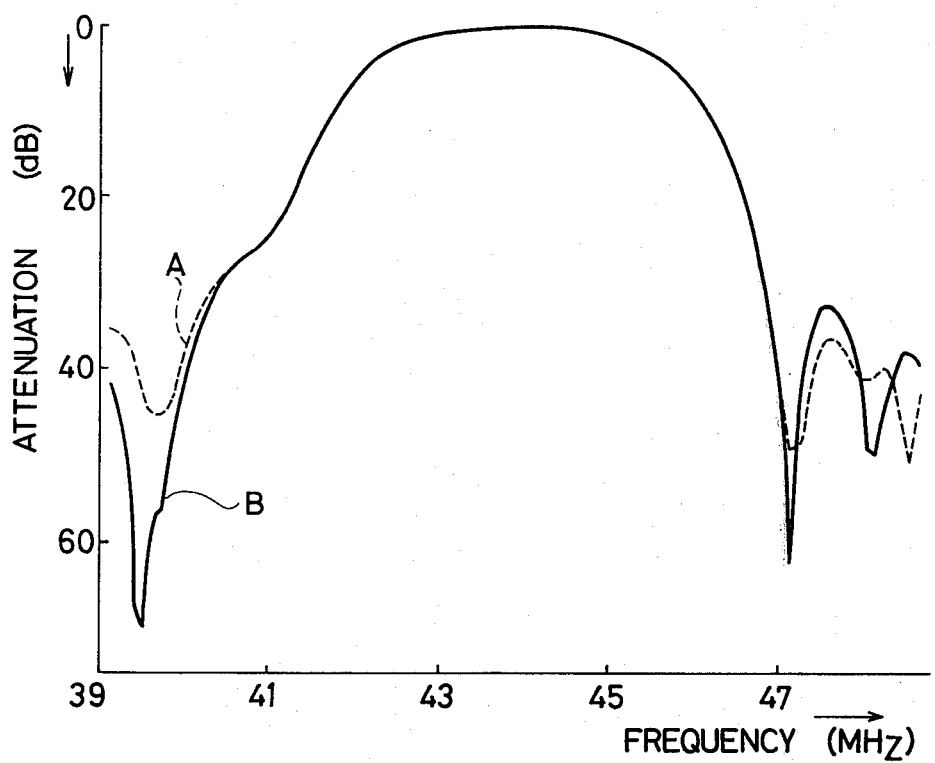
FIG. 14 is a graph for explaining the advantage of the FIG. 11 embodiment.

Furthermore, as seen from FIGS. 13A and 13B, by selecting the static capacitance ratio $C1/C2$ to be in the vicinity of 1.10, the attenuation A and B becomes extremely large, e.g. 70 dB and 60 dB, respectively. Therefore, more preferably, the static capacitance ratio $C1/C2$ in a state of only the chip is selected to be 1.10. The frequency characteristic in the case where the surface acoustic wave device having the static capacitance ratio thus selected is shown in FIG. 14. More specifically, referring to FIG. 14, the curve A shows the frequency characteristic of the conventional device having the static capacitance ratio $C1/C2=1.0$ in the state of only the chip and the curve B shows the frequency characteristic in the case of the static capacitance ratio $C1/C2=1.10$. Referring to FIG. 14, it would be appreciated that in the case of the FIG. 11 embodiment selection of the static capacitance ratio $C1/C2$ to the above described range is extremely effective.

Although the frequency characteristics shown in FIGS. 13A and 13B may be slightly changeable depending on the number of pairs of the electrode fingers and the position and the shape of the shield electrode 4 and the other interdigital electrode 3, it has been observed that when the number of pairs of the interdigital electrodes is a relatively large number such as 30 to 90, by selecting the static capacitance ratio $C1/C2$ in a state of only the chip to be the above described range, the device can be advantageously utilized in any situation.

Although in the FIG. 11 embodiment the portion electrode 22 of the interdigital electrode 2 was grounded, alternatively the common electrode 212 included in the other portion electrode 21 may be grounded. In such a case, assuming the static capacitance of the portion electrode 21 including the comb shaped electrode being grounded to be C2 and assuming the static capacitance of the other portion electrode 22 to be C1, the static capacitance ratio $C1/C2$ may be selected based on the above described thought. In the case where any of the portion electrodes is not grounded, the static capacitance of the portion electrode closer to the other interdigital electrode 3, such as the portion electrode 22, for example, is assumed to be C2 and the static capacitance of the other portion electrode 21 is assumed to be C1 and the static capacitance ratio $C1/C2$ may be selected based on the above described thought.

Figure 15:
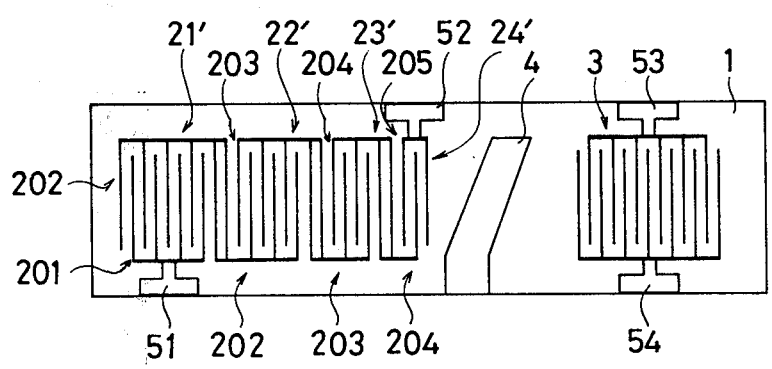
FIG. 15 is a diagram showing an electrode pattern of still a further embodiment of the present invention.

FIG. 15 is a view showing still a further embodiment of the present invention. Although in the foregoing the embodiments were described by taking an example having one interdigital electrode 2 divided into two portion electrodes, the FIG. 15 embodiment is different from the previously described embodiments in that one interdigital electrode 2 is divided into more than two portion electrodes. The portion electrode 24' adjacent to the other electrode 3 comprises a pair of mutually interdigitated comb shaped electrodes 204 and 205 and the portion electrode 23' comprises a pair of mutually interdigitated comb shaped electrodes 203 and 204, while the comb shaped electrode 204 of the portion electrode 24' and the comb shaped electrode 204 of the portion electrode 23' are electrically connected in series. Similarly, the portion electrodes 22' and 21' each comprise the comb shaped electrodes 202 and 203 and the comb shaped electrodes 201 and 202, respectively. The static capacitance of the portion electrode 24' is a capacitance formed only between the overlapped portions of the comb shaped electrodes 205 and 204 and is designated C14. Similarly, the capacitance of the portion electrodes 23', 22' and 21' are designated C13, C12 and C11, respectively.

According to the embodiment shown, the electrode pattern of the interdigital electrode 2 is structured such that the static capacitances C11, C12, C13 and C14 of the respective portion electrodes 21', 22', 23' and 24' included in the interdigital electrode 2 in a state of only the chip may be $C11 \geq C12 \geq C13 \geq C14$, where the case of $C11=C12=C13=C14$ is excluded. Generally the respective static capacitances C11 to C14 of the corresponding portion electrodes 21' to 24' are influenced by the width, the number of pairs and the overlapping lengths of the electrode fingers electrodes constituting these portion electrodes, and the dielectric constant of the substrate 1. Therefore, in the embodiment shown, the number of pairs of the electrode fingers included in the respective portion electrodes 21', 22', 23' and 24' are selected to be 4, 3.5, 2.5 and 1.5, respectively, i.e. the number of the exciting sources is 8, 7 5 and 3, so that the respective static capacitances C11, C12, C13 and C14 in a state of only the element may meet the above described relation.

Figure 16:
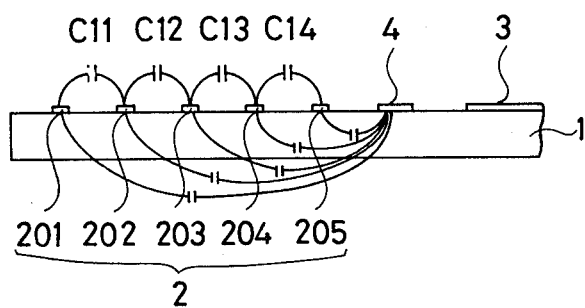
FIG. 16 is a view showing the static capacitances at various portions of a surface acoustic wave device when the device is actually installed for explaining the FIG. 15 embodiment.

On the other hand, in a state where the surface acoustic wave device is actually installed in an electric circuit, stray capacitances are formed between those portion electrodes 24', 23', 22' and 21' and the shield electrode 4 and the other electrode 3, as the major thereof are shown in FIG. 16, so that such stray capacitances are added to the above described capacitances C14, C13, C12 and C11. Such stray capacitances of the portion electrodes become larger in succession from the portion electrode farthest from the shield electrode 4 and the other electrode to the portion electrode closest the shield electrode 4 and the other electrode 3. Since the capacitances between the comb shaped electrodes 204 and 205, between the comb shaped electrodes 203 and 204, between the comb shaped electrodes 202 and 203 and between the comb shaped electrodes 201 and 202 of the respective pairs are the sums of the capacitances C14, C13, C12 and C11 of the above described portion electrodes and the above described stray capacitances, respectively, the capacitances between the comb shaped electrodes of the respective pairs in a state where the device is actually installed becomes substantially equal to each other. Accordingly, when a voltage is applied between the lead electrodes 51 and 52, the applied voltage is divided, so that approximately a quarter divided voltage is applied to each of the portion electrodes 21', 22', 23' and 24', whereby the voltage applied between the adjacent electrode fingers becomes the same. As a result, the frequency characteristic is not degraded by the splitting per se. It has been confirmed that according to the embodiment shown in a state where the same is actually installed a frequency characteristic having good attenuation as shown by the curve B in FIG. 2 is obtained. In case of the FIG. 15 embodiment, the same relation is employed even when the electrode 205 is connected to the ground and even when the rear surface electrode connected to the ground is provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A surface acoustic wave device, comprising:

a substrate;

first and second sets of interdigital electrodes disposed on said substrate, said sets of interdigital electrodes being spaced apart from each other by a given distance, each said set of interdigital electrodes comprising a pair of comb-shaped electrodes interdigitated with each other;

said first set of interdigital electrodes being divided into first and second adjacent portion interdigital electrodes along a propagating direction of said surface acoustic wave device, said first and second adjacent portion interdigital electrodes being electrically connected to each other in series, one of said comb-shaped electrodes of one of said portion interdigital electrodes being adapted to be connected to a reference potential; and the electrode pattern of said first set of interdigital electrodes being such that the static capacitance of one of said first and second portion interdigital electrodes is different than the static copacitance of the other of said first and second portion interdigital electrodes.

2. A surface acoustive wave device, comprising:
a substrate;

first and second sets of interdigital electrodes disposed on said substrate, said sets of interdigital electrodes being spaced apart from each other by a given distance, each of said sets of interdigital electrodes comprising a pair of comb-shaped electrodes interdigitated with each other;

said first set of interdigital electrodes being divided into first and second adjacent portion interdigital electrodes along a propagating direction of said surface acoustic wave device, said first and second adjacent portion interdigital electrodes being electrically connected to each other in series; and the electrode pattern of said first set of interdigital electrodes being selected such that the static capacitance of the portion interdigital electrode thereof which is closer to said second set of interdigital electrodes is smaller than the static capacitance of the other said portion interdigital electrode.

3. A surface acoustic wave device in accordance with claim 1 or 2, wherein the electrode patterns of said two portion interdigital electrodes are selected to be asymmetrical relative to each other.

4. A surface acoustic wave device in accordance with claim 1 or 2, wherein each said comb-shaped electrode comprises a plurality of electrode fingers, the total number of pairs of electrode fingers of said first set of interdigital electrode being selected to be a relatively small number; and the ratio of the larger said static capacitance to the smaller said static capacitance being selected to be in the range of 1.03 to 1.45.

5. A surface acoustic wave device in accordance with claim 4, wherein
said ratio is selected to be in the range of 1.08 to 1.35.

6. A surface acoustic wave device in accordance with claim 4, wherein said relatively small number of electrode finger pairs is selected to be in the range of 5 to 20.

7. A surface acoustic wave device in accordance with claim 1 or 2, wherein each said comb-shaped electrode comprises a plurality of electrode fingers, the total number of pairs of said electrode fingers of said first set of interdigital electrodes being selected to be a relatively large number; and the ratio of the larger said static capacitance to the smaller said static capacitance being selected to be in the range of 1.01 to 1.20.

8. A surface acoustic wave device in accordance with claim 7, wherein
said ratio is selected to be in the range of 1.03 to 1.17.

9. A surface acoustic wave device in accordance with claim 7, wherein said relatively large number of electrode finger pairs is selected to be in the range of 30 to 90.

10. A surface acoustic wave device in accordance with claim 5, wherein said relatively small number of electric finger pairs is selected to be in the range of 5 to 20.

11. A surface acoustic wave device in accordance with claim 8, wherein said relatively large number of electrode finger pairs is selected to be in the range of 30 to 90.

12. A surface acoustic wave device, comprising:
a substrate;

first and second sets of interdigital electrodes disposed on said substrate, said sets of interdigital electrodes being spaced apart from each other by a given distance;

said first set of interdigital electrodes being divided into n portion interdigital electrodes connected in series with each other, n being an integer greater than 2, the static capacitances of each of said n portion interdigital electrodes not all being equal, the static capacitance of each said portion interdigital electrode being no less than the static capacitance of the remaining portion interdigital electrodes which are located closer to said second set of interdigital electrodes than it is.

* * * * *